(12) United States Patent
Ichitsubo et al.

(10) Patent No.: US 7,493,094 B2
(45) Date of Patent: Feb. 17, 2009

(54) MULTI-MODE POWER AMPLIFIER MODULE FOR WIRELESS COMMUNICATION DEVICES

(75) Inventors: Ikuroh Ichitsubo, Kanagawa Prefecture (JP); Guan-Wu Wang, Palo Alto, CA (US); Weiping Wang, Palo Alto, CA (US)

(73) Assignee: Micro Mobio Corporation, Palo Alto, CA (US)

( * ) Notice: Subject to any disclaimer, the term of this patent is extended or adjusted under 35 U.S.C. 154(b) by 792 days.

(21) Appl. No.: 11/110,249

(22) Filed: Apr. 20, 2005

(65) Prior Publication Data

US 2006/0160503 A1    Jul. 20, 2006

Related U.S. Application Data

(63) Continuation-in-part of application No. 11/039,162, filed on Jan. 19, 2005, now Pat. No. 7,123,088.

(51) Int. Cl.
*H04B 1/04* (2006.01)
(52) U.S. Cl. .................. 455/127.1; 455/232.1; 455/323; 455/334
(58) Field of Classification Search .................. 455/323, 455/333, 334, 289, 249.1, 110, 293, 232.1; 327/254, 117
See application file for complete search history.

(56) References Cited

U.S. PATENT DOCUMENTS 4,977,041 A    12/1990    Shiozawa
5,050,238 A    9/1991    Tomizuka
5,164,683 A    11/1992    Shields
5,255,324 A    10/1993    Brewer
5,283,539 A    2/1994    Sadhir
5,541,554 A *  7/1996    Stengel et al. ................ 330/51
5,548,239 A    8/1996    Kohama
5,608,364 A    3/1997    Hirai
5,625,894 A    4/1997    Jou
5,656,972 A    8/1997    Norimatsu
5,697,087 A    12/1997    Miya
5,732,334 A    3/1998    Miyake
5,825,227 A    10/1998    Kohama
5,880,635 A    3/1999    Satoh
5,969,560 A    10/1999    Kohama
6,025,651 A    2/2000    Nam
6,075,995 A    6/2000    Jensen
6,118,985 A    9/2000    Kawakyu
6,148,220 A    11/2000    Sharp
6,151,509 A    11/2000    Chorey
6,175,279 B1   1/2001    Ciccarelli
6,183,703 B1   2/2001    Hsu
6,198,351 B1   3/2001    Winslow (Continued)

OTHER PUBLICATIONS

U.S. Appl. No. 10/385,059, filed Feb. 7, 2005, Ikuroh Ichitsubo.

(Continued)

*Primary Examiner*—Tony T Nguyen
(74) *Attorney, Agent, or Firm*—Xin Wen

(57) ABSTRACT

A power amplifier can amplify an input radio frequency signal to produce an output radio frequency signal in response to a bias control signal. A programmable digital control unit produces the bias control signal and to transmit the bias control signal to the power amplifier.

20 Claims, 9 Drawing Sheets

U.S. PATENT DOCUMENTS

| | | | |
|---|---|---|---|
| 6,203,587 B1 | 3/2001 | Lesieur | |
| 6,262,630 B1 | 7/2001 | Eriksson | |
| 6,265,943 B1 | 7/2001 | Dening | |
| 6,265,954 B1 | 7/2001 | Krause | |
| 6,281,755 B1 | 8/2001 | Feld | |
| 6,281,762 B1 | 8/2001 | Nakao | |
| 6,294,967 B1 | 9/2001 | Hirai | |
| 6,326,866 B1 | 12/2001 | Sasaki | |
| 6,366,788 B1 | 4/2002 | Fujioka | |
| 6,417,730 B1 | 7/2002 | Segallis | |
| 6,462,622 B1 | 10/2002 | Mori | |
| 6,483,398 B2 | 11/2002 | Nagamori | |
| 6,496,684 B2 | 12/2002 | Nakao | |
| 6,625,050 B2 | 9/2003 | Suwa | |
| 6,630,372 B2 | 10/2003 | Ball | |
| 6,639,466 B2 | 10/2003 | Johnson | |
| 6,677,833 B2 | 1/2004 | Sheen | |
| 6,678,506 B1 | 1/2004 | Dolman | |
| 6,683,512 B2 | 1/2004 | Nakamata | |
| 6,693,498 B1 | 2/2004 | Sasabata | |
| 6,694,129 B2 | 2/2004 | Peterzell | |
| 6,696,903 B1 | 2/2004 | Kawahara | |
| 6,720,850 B2 | 4/2004 | Sasabata | |
| 6,762,659 B2 | 7/2004 | Son | |
| 6,774,718 B2 | 8/2004 | Ichitsubo | |
| 6,798,287 B2 | 9/2004 | Wu | |
| 6,819,941 B2 * | 11/2004 | Dening et al. | 455/552.1 |
| 6,822,515 B2 | 11/2004 | Ichitsubo | |
| 6,847,262 B2 | 1/2005 | Ichitsubo | |
| 6,911,942 B2 | 6/2005 | Fukuda | |
| 6,914,482 B2 | 7/2005 | Ichitsubo | |
| 6,944,437 B2 * | 9/2005 | Yang et al. | 455/323 |
| 7,071,783 B2 | 7/2006 | Ichitsubo | |
| 7,313,416 B1 * | 12/2007 | Harmon et al. | 455/562.1 |
| 2004/0203552 A1 | 10/2004 | Horiuchi et al. | |
| 2005/0179498 A1 | 8/2005 | Tsutsui et al. | |
| 2005/0239415 A1 | 10/2005 | Sagae et al. | |
| 2006/0164188 A1 | 7/2006 | Yamada | |

OTHER PUBLICATIONS

U.S. Appl. No. 10/804,737, filed Mar. 18, 2004, Ikuroh Ichitsubo.
U.S. Appl. No. 10/843,409, filed May 10, 2004, Ikuroh Ichitsubo.
U.S. Appl. No. 10/919,850, filed Aug. 16, 2004, Shinsuke Inui.
U.S. Appl. No. 10/938,779, filed Sep. 10, 2004, Ikuroh Ichitsuho.
U.S. Appl. No. 10/972,636, filed Oct. 24, 2004, Kenya Kubota.
U.S. Appl. No. 11/039,687, filed Jan. 19, 2005, Ikuroh Ichitsubo.
U.S. Appl. No. 11/064,261, filed Feb. 24, 2005, Ikuroh Ichitsubo.
U.S. Appl. No. 11/110,249, filed Apr. 20, 2005, Ikuroh Ichitsubo.
U.S. Appl. No. 11/121,288, filed May 2, 2005, Ikuroh Ichitsubo.
U.S. Appl. No. 11/126,687, filed May 11, 2005, Ikuroh Ichitsubo.
U.S. Appl. No. 11/152,308, filed Jun. 14, 2005, Ikuroh Ichitsubo.
U.S. Appl. No. 11/173,741, filed Jul. 2, 2005, Ikuroh Ichitsubo.
U.S. Appl. No. 11/173,965, filed Jul. 2, 2005, Ikuroh Ichitsubo.
U.S. Appl. No. 11/173,968, filed Jul. 2, 2005, Ikuroh Ichitsubo.
U.S. Appl. No. 11/323,763, filed Dec. 30, 2005, Ikuroh Ichitsubo.
U.S. Appl. No. 11/323,788, filed Dec. 30, 2005, Ikuroh Ichitsubo.
U.S. Appl. No. 11/433,896, filed May 12, 2006, Ikuroh Ichitsubo.
U.S. Appl. No. 11/488,465, filed Jul. 14, 2006, Ikuroh Ichitsubo.

* cited by examiner

MULTI-MODE POWER AMPLIFIER MODULE FOR WIRELESS COMMUNICATION DEVICES

RELATED APPLICATION

The present invention is a Continuation-in-Part to U.S. patent application Ser. No. 11/039,162, titled "Power Amplifier Module for Wireless Communication Devices" by Ichitsubo et al, filed on Jan. 19, 2005 now U.S. Pat. No. 7,123,088. The present invention is related to the commonly assigned U.S. patent application Ser. No. 10/041,863, titled "Multilayer RF Amplifier Module" by Wang, et al., filed on Oct. 22, 2001, U.S. patent application Ser. No. 10/385,058, titled "Power Amplifier Module for Wireless Communication Devices" by Ichitsubo et al, filed on Mar. 9, 2003, U.S. patent application Ser. No. 10/385,059, titled "Accurate Power Sensing Circuit for Power Amplifiers" by Ichitsubo et al, filed on Mar. 9, 2003, U.S. patent application Ser. No. 10/804,737, titled "RF Front-end Module for Wireless Communication Devices" by Ichitsubo et al., filed Mar. 18, 2004, U.S. patent application Ser. No. 10/972,858, titled "Frequency Filtering Circuit for Wireless Communication Devices" by Kubota et al, filed Oct. 25, 2004, U.S. patent application Ser. No. 10/972,636, titled "Diplexer Circuit for Wireless Communication Devices" by Kubota et al, filed Oct. 25, 2004, and U.S. patent application Ser. No. 11/039,687, titled "Multi-band Power Amplifier Module for Wireless Communications" by Ichitsubo et al, filed Jan. 19, 2005. The disclosures of these related applications are hereby incorporated by reference.

BACKGROUND

The present invention relates to radio frequency (RF) power amplifiers (PA) module. Portable devices such as laptop personal computers (PC), Personal Digital Assistant (PDA) and cellular phones with wireless communication capability are being developed in ever decreasing size for convenience of use. Correspondingly, the electrical components thereof must also decrease in size while still providing effective radio transmission performance. However, the substantially high transmission power associated with RF communication increases the difficulty of miniaturization of the transmission components.

One important requirement for the state-of-the-art wireless devices is to provide power amplification in a plurality of frequency bands and a plurality of communication standards with different digital modulation method. The quality and power level of the amplified RF signals need to be properly controlled. For example, for high data rate wireless applications, the output signals is required to be linear over a wide signal power range in each of the plurality of frequency bands. Preferably the amplification is reduced or increased according to input RF signal, transmittance range and data rate so that power consumption can be optimized.

Furthermore, wireless communication devices are also used receive and transmit signals under different standards, protocols and frequency bands. Various standards and protocols can specify a wide range of wireless applications spanning from mobile devices, information technologies to consumer electronics. Providing users wireless communication capabilities under different standards, protocols and frequency bands has been a challenge to the wireless equipment and in particular RF power amplifiers.

SUMMARY

In one aspect, the present application relates to a power amplifier configured to amplify an input radio frequency signal to produce an output radio frequency signal in response to a bias control signal; and
a programmable digital control unit configured to produce the bias control signal and to transmit the bias control signal to the power amplifier.

In another aspect, the present application relates to a multi-mode power amplifier module, comprising:
a power amplifier configured to amplify an input radio frequency signal to produce an output radio frequency signal in response to a base current and a power supply voltage;
a programmable digital control unit configured to digitally produce a bias control signal and to digitally control the power supply voltage to a plurality of levels; and
a biasing circuit configured to receive the bias control signal from the programmable digital control unit and to control the biasing current or the biasing voltage of the power amplifier to one of a plurality of levels.

In another aspect, the present application relates to a wireless communication device capable of transmitting and receiving wireless signals at multiple standards, comprising:
an antenna adapted to receive a wireless signal at one of a plurality of wireless standards and to produce an input radio frequency signal;
a power amplifier configured to amplify the input radio frequency signal to produce an output radio frequency signal in response to a base current and a power supply voltage;
a programmable digital control unit configured to digitally produce a bias control signal and to digitally control the power supply voltage to a plurality of levels;
a biasing circuit configured to receive the bias control signal from the programmable digital control unit and to control the biasing current or the biasing voltage of the power amplifier to one of a plurality of levels; and
a base band processor configured to digitally process the output radio frequency signal.

An advantage of the present invention is that the power amplifier can be digitally programmed to amplify radio frequency signals for various wireless data and voice communications standards and protocols for telephony, information technologies, and consumer electronics applications in according to the types of digital modulation methods used. The disclosed apparatus and methods are applicable to cellular wireless communication standards such as 2G, 2.5G and 3G cellular including Global System for Mobile Communications (GSM), General Packet Radio Service (GPRS), EDGE, Code Division Multiple Access (CDMA), Wideband CDMA, TD-SCDMA, Universal Mobile Telecommunications System (UMTS), etc., Wi-Fi wireless communication standards such as IEEE 802.11, and Wi-Max wireless communication standards such as IEEE 806.16, and others.

The disclosed device can be digitally controlled either by parallel or serial digital signals, to adapt to wireless applications of multiple standards and protocols. The increased features and flexibility of the disclosed device are therefore more convenient and economic for the users because they do not have to switch between different wireless devices that are dedicated to specific wireless standards and protocols.

By integrating functions of multiple standards, the disclosed device reduces the foot print of the wireless device, which is beneficial to the miniaturization of the electronic and communication devices. The digital control function can be achieved by dedicated digital unit or by the base band processor.

The programming capability also allows the disclosed device to improve both power consumption efficiency and amplification linearity in a single device. The disclosed device can dynamically set biasing current and the biasing voltage of the power amplifier to minimize the power consumption and avoid distortion in the output signals.

Furthermore, the disclosed device is applicable to multi-band wireless communications over a wide frequency range. The capability of dynamic bias setting also reduces spurious emissions, improves Adjacent Channel Power Ratio (ACPR), Error Vector Magnitude (EVM), and Adjacent Channel Leakage Ratio (ACLR).

In another aspect, the present invention provides a power amplifier module for amplifying radio frequency signals, comprising: a) a radio frequency power amplifier including one or more semiconductor transistors, adapted to receive an input radio frequency signal and a processed power-sensing control signal, and to output an amplified radio frequency signal; b) a power-sensing circuit adapted to receive the amplified radio frequency signal and to output the power-sensing control signal, and c) a control logic that receives and processes the power-sensing control signal, and outputs a processed power-sensing control signal in response to a quality or a magnitude of the amplified radio frequency signal.

The PA module disclosed in this invention is a linear amplifier which provides good linearity and low harmonics over a wide frequency range covering from several megahertz (MHZ) to tens of gigahertz (GHZ) by the feedback control based on the qualities and power level of the amplified radio frequency signal. Specifically, high order inter-modulation distortions are suppressed. The RF power amplifier module is suitable to applications in various wireless data and voice communications standards and protocols, including cellular wireless communication standards such as 2G, 2.5G and 3G cellular, Wi-Fi, and Wi-Max wireless communication standards, and others.

In another aspect, a number of electronic components and circuits are integrated within the RF amplifier module, including impedance matching circuits for input and output RF signals. The RF amplifier module is compact and has smaller foot print compared to prior art implementations. The integrated RF amplifier module can be conveniently designed and assembled in a RF transmission device.

Another feature of the PA module in the present invention is that the output signal from the power sensing circuit can be used to optimally control the biasing current/voltage and operation characteristics of the power amplifiers. As a result, the PA module provides highly linear output power at reduced current consumption.

Yet another feature of the invention is that the RF amplifier design enables manufacturing consistency since the input and output matching circuits are included in the module. Common problems related to the manufacturing tolerance of the matching circuit components are therefore eliminated. The RF amplifier design is adapted to high frequency circuitry by utilizing semiconductor materials such as Gallium Arsenide Heterojunction Bipolar Transistors (GaAs HBT).

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become apparent from the following description and appended claims, or may be learned by the practice of the invention as set forth hereinafter.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The PA module provides a unitary or common component which may be conveniently assembled in a RF transmission device, with correspondingly simplified assembly, compact 3D size, and enhanced RF amplification performance. In accordance with the present invention, the term "module" refers to such a unitary device for wireless communications, comprising integrated power amplifiers and other circuitry and auxiliary electronic components.

Figure 1:
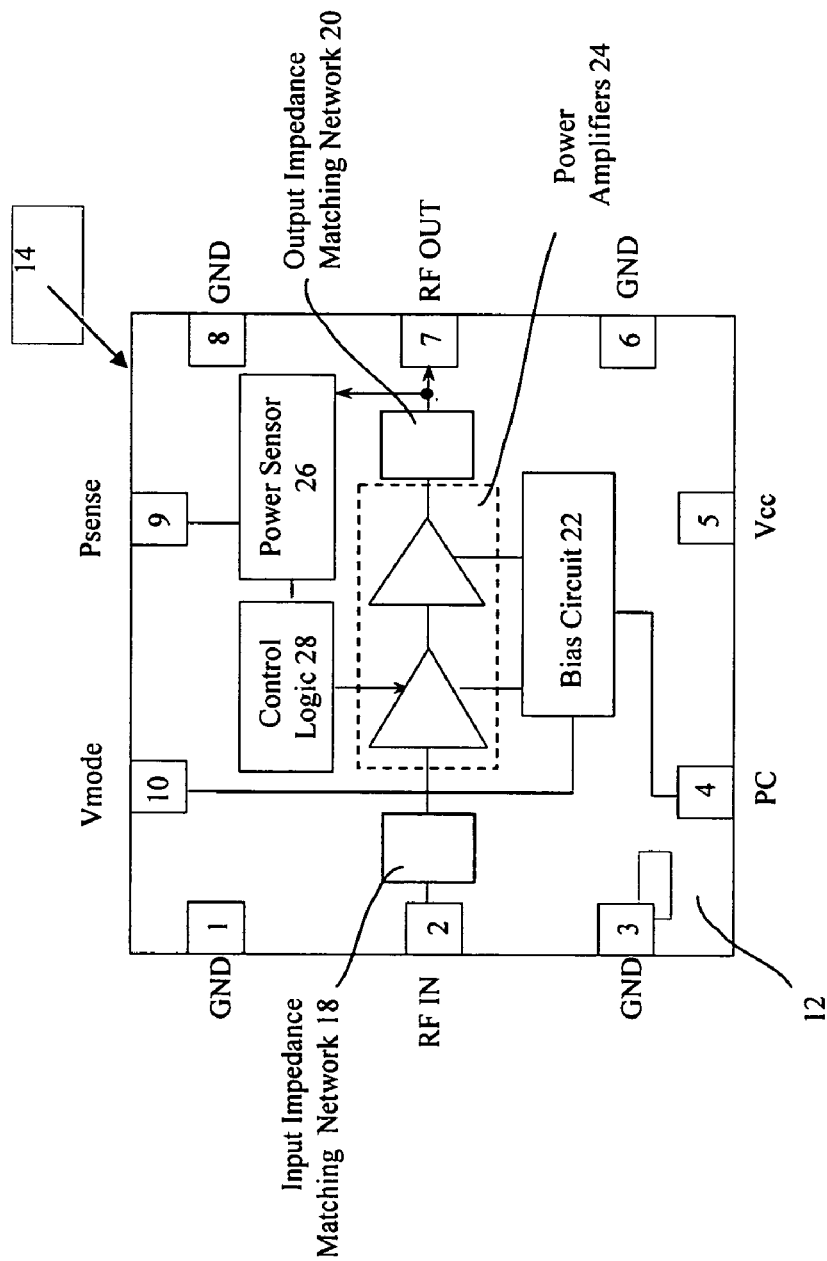
FIG. 1 is a system diagram of the power amplifier module for wireless communications in accordance to the present invention.

FIG. 1 shows a system diagram of the radio frequency PA module 14 for wireless communications in accordance to an embodiment of the present invention. The PA module is built on a substrate 12, which can be a multiplayer printed circuit board (PCB), lead frame, lower-temperature co-fired ceramics (LTCC), or other suitable electronic materials. The substrate includes metal Pins adapted to receive connecting terminals of integrated circuits including the Power Amplifiers 24, the Bias Circuit 22, the Power Sensor 26, and optionally Control Logic 28. The Power Amplifiers 24, the Power Sensor 26, the Bias Circuit 22, can be fabricated in an integrated circuit on a semiconductor chip. The Power Amplifiers 24 can be of one or multiple stages. In the particular example shown in FIG. 1, two sequentially connected stages of power transistors are employed. The amplifier IC chip has an electrically conductive metal layer to be bonded to the top metal layer of the module.

The PA module 14 can also include, in accordance with another feature of the present invention, input impedance matching circuit 18 and output impedance matching circuit 20. The input and output impedance matching networks are preferably based on the 50-ohm standard of the RF industry. Details of impedance matching circuits are described in the above referenced and commonly assigned U.S. patent application Ser. No. 10/041,863, filed on Oct. 22, 2001, titled "Multilayer RF Amplifier Module", by Wang, et al.

The Bias Circuit 22 is used to bias individual stage with suitable current so the amplifiers can operate with minimal signal distortion. The Bias Circuit receives input from the power control signal from the PC port (Pin 4) and can be selected to operate at different settings of idle current using the Vmode port (Pin 10). In accordance with the present invention, the mode control signal and the power-control signal may be dependent at least partially on the power-sensing signal output from the Power Sensor circuit 26.

The PA module is integrated with a Power Sensor circuit 26 that senses the level of the output power. Details of the power sensor circuit are disclosed in the above referenced and commonly assigned U.S. patent application "Accurate Power Sensing Circuit for Power Amplifiers" by Ichitsubo et al., the disclosure of which related application is incorporated herein by reference.

A power amplifier with good linearity generally must maintain a constant amplification factor, known as "Gain", which is defined as the ratio of the output signal power level to the input signal power level. However, at high output power level, the power amplifier can be driven close to saturation and a constant gain becomes difficult to maintain. As a result, the quality of digital communication, commonly measured by Error Vector Magnitude (EVM), Bit Error Rate (BER), or Packet Error Rate (PER), degrades at high output power level.

The Power Sensor 26 receives the amplified radio frequency signal from Power Amplifiers 24 and to output a power-sensing control signal. The Control Logic 28 receives and processes the power-sensing control signal, and outputs a processed power-sensing control signal to control Power Amplifiers 24. The processed power-sensing control signal is a function of a quality or a magnitude of the amplified radio frequency signal. For example, the Control Logic 28 improves the linearity performance of power amplifier using the Power Sensor 26 feedback internally. By adjusting the bias of the amplifier depending on the actual output power measured by the Power Sensor 26, it reduces the tendency of saturation and maintains a more constant gain. Thus the linearity of the amplification over a wide range of power is improved. Yet another method of improving the quality of digital communication is to use an external controller to adjust the input RF signal based the known relationship of digital communication quality to output power level.

The PA module 14 shown in FIG. 1 can be used in a wide range wireless communication devices such as cellular phone, mobile computers, and handheld wireless digital devices. The PA module has a miniature size of a few millimeters.

Figure 2:
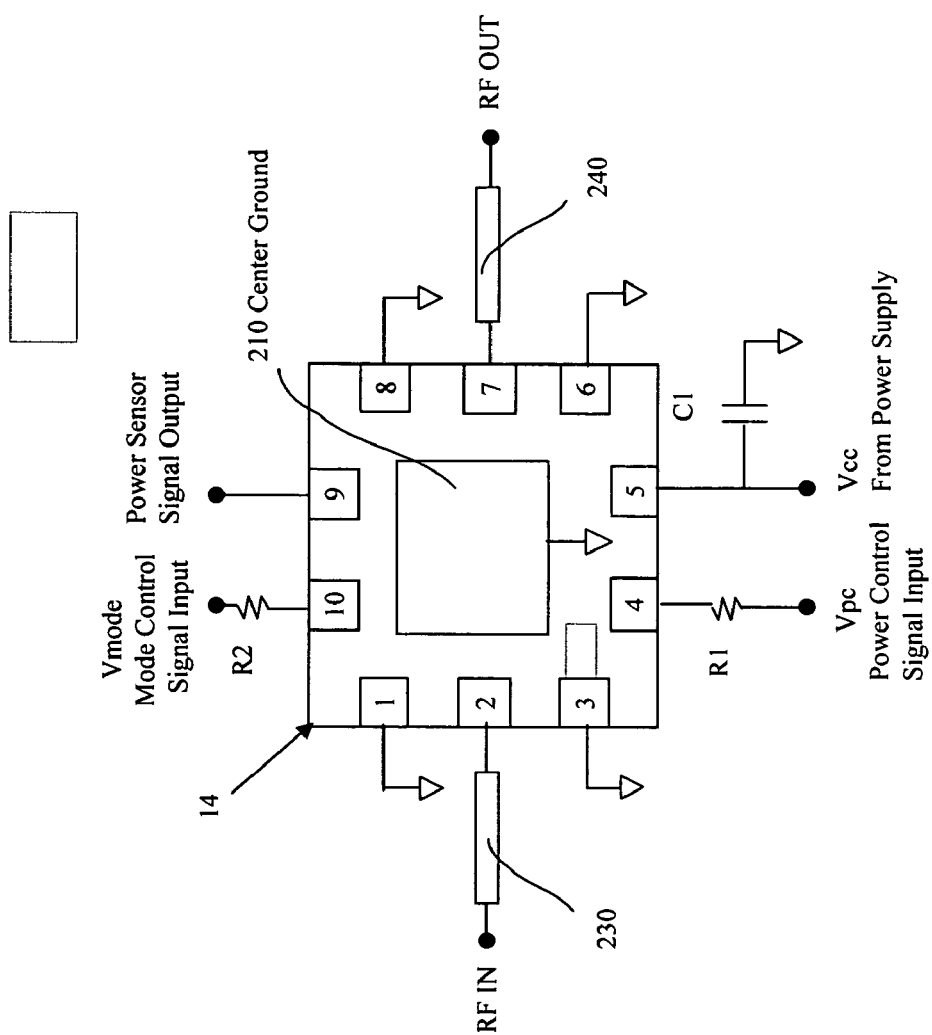
FIG. 2 is the electrical schematics for the application of the power amplifier module shown in FIG. 1 in accordance to an embodiment of the present invention.

FIG. 2 is the electrical schematics illustrating the application of the PA module 14, as shown in FIG. 1, to wireless communications in accordance to the present invention. The PA module has a plurality of metal Pins, namely, Pin 1 through 10 and the Center Ground 210. Pin 1, 3, 6 and 8 are adapted to be connected to the electric ground. Pin 2 (RF IN port) is connected through a 50-ohm transmission line 230 to an RF input signal to be supplied to the Power Amplifiers 24. The output of the power amplifier chip 24 is at Pin 7 (RF OUT port), also connected by a 50-ohm transmission line 240 to the antenna stage, possibly with a filter and transmit/receive switch in between. Pin 4 (PC port) receives a power control signal, while Pin 5 (Vcc port) receives DC power supply. Pin 9 (Psense port) provides a power sensing signal output, while Pin 10 (Vmode port) optimally receives a mode control signal. A series resistor $R_2$ can be used to set the DC voltage to Vmode advantageously depending on the requirement of linear power output or the characteristics varying RF signal.

Typically, the power supply comes from a regulated voltage source to the Vcc port. The PA can be switched ON/OFF by presenting a high and low signal at the PC port. The voltage of high signal the PC port may be optimally adjusted with an external resistor R1. When it is switched to the OFF state, the bias to the power amplifier is shut off and the current consumption is reduced to very small. Thus, the PC port is also commonly referred as "PA_ON", or "PA_ENABLE", etc.

In one embodiment, the input impedance matching network 18, the output impedance matching network 20, the power amplifiers 24, the bias circuit 22 and the power sensor 26 are integrated on an integrated circuit (IC). The IC includes top terminals or bonding pins, which provide various input and output connections to the internal components of the chip. The top terminals are electrically joined to one or more of the plates in the substrate 12. In the preferred embodiment, the chip includes Gallium Arsenide Heterojunction Bipolar Transistors (GaAs HBT). However, other semiconductor materials may also be used.

Figure 3:
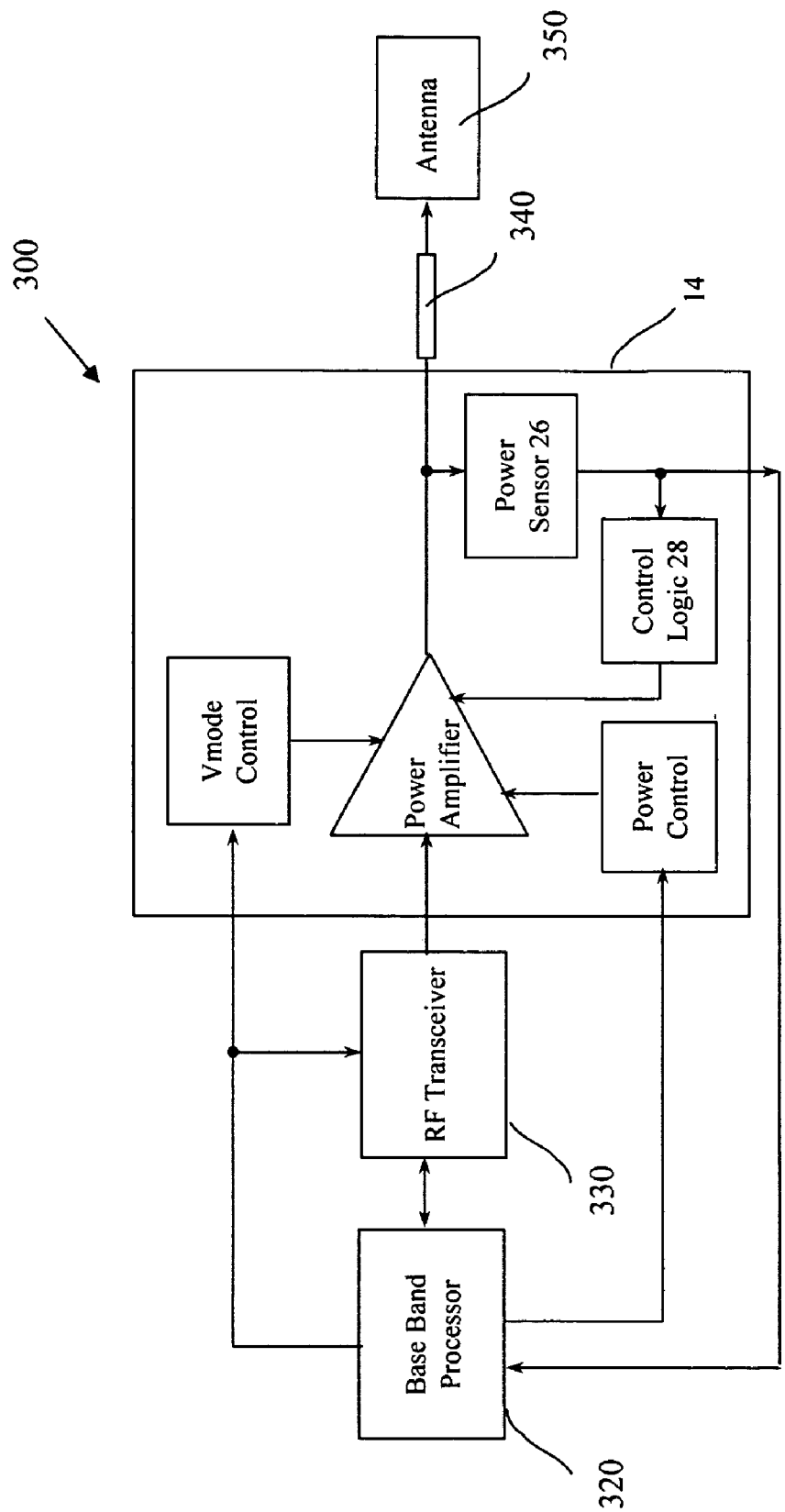
FIG. 3 illustrates the use of the power amplifier module for wireless communications in accordance to an embodiment of the present invention.

FIG. 3 illustrates an exemplary use of the radio frequency PA module for digital wireless communications in accordance to the present invention. The wireless communication device 300 can be a PDA, a WLAN adaptor, or a cellular phone. The wireless communication device 300 includes a base band processor core 320, RF transceivers 330, PA module 14, and a 5-ohm impedance transmission line or micro strip 340 connected to antenna 350.

A base band chip generates digitally modulated signals. The frequency is up-converted by a RF transceiver to a RF frequency band suitable for transmitting. The RF signal is amplified by the PA module 14 for transmission by the antenna. The PA module can be turned ON/OFF by the power control signal. The Vmode control (Pin 10) is used to control and internal settings of the bias circuits by the base band processor 320, which has the knowledge of the digital signal modulation type and the linear output requirement. For example, when the device is transmitting high power, the Vmode control pin set the power amplifier operating in high current to minimize output distortion. When the device needs to transmit low power, the Vmode control pin 10 sets the power amplifier with low current to conserve battery life.

The Power Sensor 26 measures the output RF power, which can be advantageously used externally to the PA module. For example, the output of power sensor can be used by the baseband processor 320 to set the transmitting power level for the wireless device by varying the RF input signal to PA module.

Figures 4A, 4B:
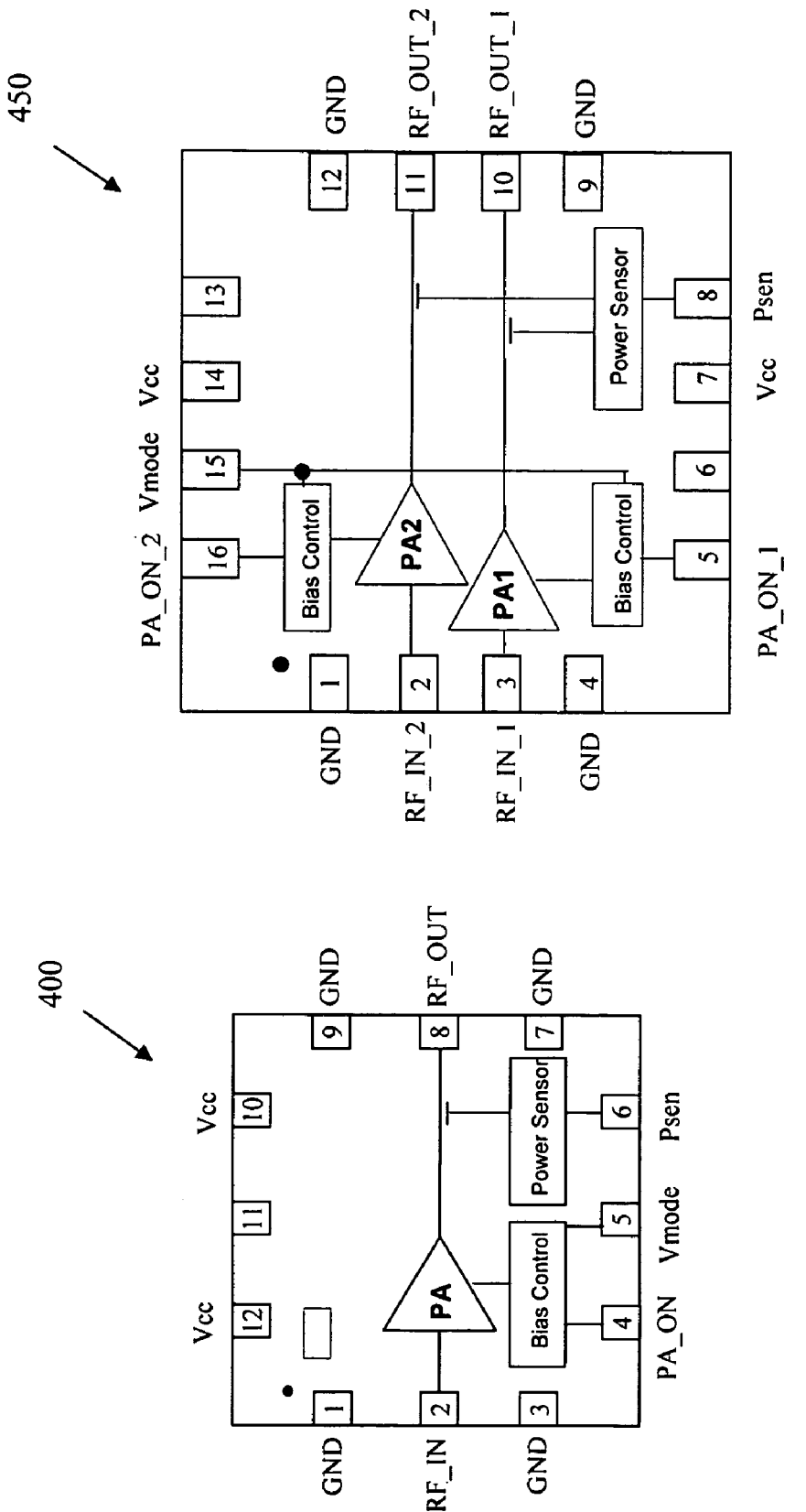
FIG. 4A illustrates the electrical schematics of a single-band power amplifier module.
FIG. 4B illustrates the electrical schematics of a dual-band power amplifier module.

FIG. 4A and FIG. 4B respectively illustrate the electrical schematics of a single-band power amplifier module 400 and a dual-band power amplifier module 450. The single-band power amplifier module 400 comprises a power amplifier that can amplify wireless signal in a frequency band. The electrical terminals include "PA_ON" for receiving signals to turns power amplifier ON and OFF, "Psen" for power sensor output, and "Vmode" for mode control signal input. If more than one bit is used to control the PA, the control signal input can be either in serial or in parallel. If more than one bit in parallel is used, then the unassigned pin(s) on the module can be used as necessary. The dual-band power amplifier module 450 comprises two power amplifiers that can amplify wireless signals in at least two frequency bands. Each of the two power amplifiers is connected to similar electrical terminals as the single-band power amplifier module 400.

Figure 5:
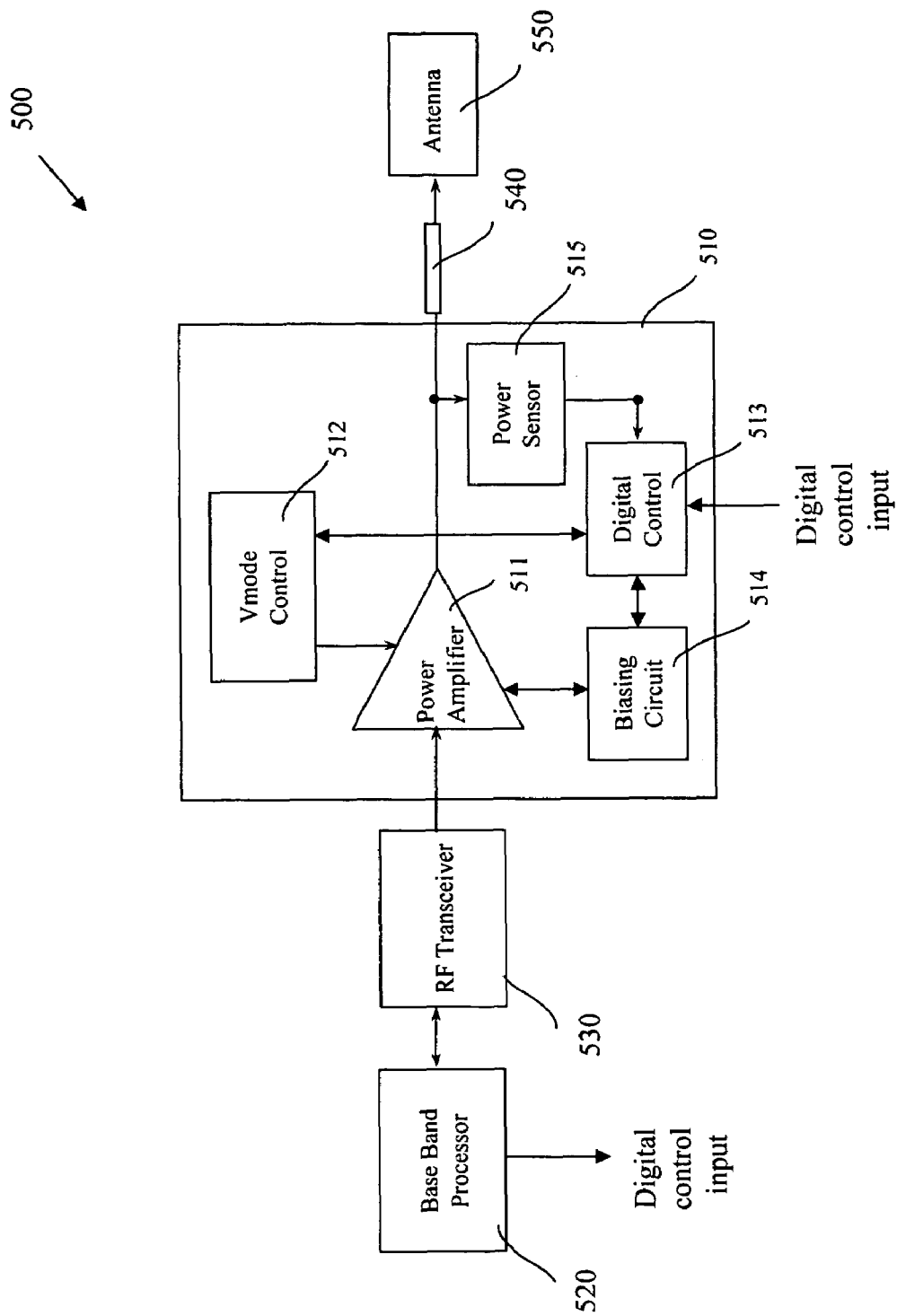
FIG. 5 illustrates a block diagram of a wireless communication device comprising a multi-protocol programmable power amplifier in accordance to the present invention.

In another embodiment, a wireless communication device 500 shown in FIG. 5 can be a cellular phone, mobile computers, handheld wireless digital devices, a WLAN adaptor, and other wireless electronic devices. The wireless communication device 500 is compatible with cellular wireless communication standards such as 2G, 2.5G and 3G including Global System for Mobile Communications (GSM), General Packet Radio Service (GPRS), EDGE, Code Division Multiple Access (CDMA), Wideband CDMA, TD-SCDMA, Universal Mobile Telecommunications System (UMTS), etc., Wi-Fi wireless communication standards such as IEEE 802.11, and Wi-Max wireless communication standards such as IEEE 806.12, and others.

The wireless communication device 500 includes a multi-mode programmable radio frequency (RF) power amplifier module 510, a base band processor 520, RF transceivers 530, and an impedance transmission line (or micro strip) 540, and an antenna 550. The base band processor 520 generates digitally modulated signals that are converted by the RF transceiver 530 to radio frequencies suitable for transmission. The RF signals are amplified by the RF power amplifier module 510 and subsequently transmitting by the antenna 550. The multi-mode programmable radio frequency (RF) power amplifier module 510 is capable of responding to different communication and digital modulation standards.

The RF power amplifier module 510 can be a unitary component that can be conveniently assembled in the wireless communication device 500. The RF power amplifier module 510 includes the power amplifier 511 and other circuitry and auxiliary electronic components integrated in the RF power amplifier module 510. In particular, a power amplifier 511 amplifies input radio-frequency signals and outputs amplified radio-frequency signals to the impedance transmission line 540. The power amplifier 511 can comprise one or a plurality of power transistors. The power transistors can be cascaded to provide desired gain factors, linearity and other characteristics. The output characteristics of the power amplifier 511 are dependent on the base currents and the power supply voltages of the one or more power transistors in the power amplifier 511.

A power sensing circuit 515 can detect the power of the amplified output radio-frequency signals by, for example, capacitance coupling. The power sensing circuit 515 produces a power sensing signal that represents the output power of the amplified radio-frequency signals.

In accordance with the present invention, a digital control unit 513 can digitally control the biasing currents and the biasing voltages of the power transistors in the power amplifier 511. The digital control unit 513 can receive external input signals. The external input signals can be in serial or parallel. The external input signals can for example be provided by the base band processor 520. The digital control unit 513 can also receive the power sensing signal from the power sensing circuit 515. In one arrangement, the digital control unit 513 can be replaced by the base band processor 520. In other words, the base band processor 520 can provide digital control functions to the power amplifier 511 in addition to its regular digital processing functions.

The digital control unit 513 controls the power amplifier 511 by sending Vmode control signals to a Vmode control circuit 512 and bias control signals to a biasing circuit 514. Vmode control circuit 512 controls the power supply voltage of the power transistors in response to Vmode control signals produced by digital control unit 513. The Vmode control can thus be dependent on the output power of the amplified radio-frequency signals via input to the digital control unit 513. The control over power supply voltage can affect the collector voltages that in turn can affect the biasing currents of the power transistors. For example, when the wireless communication device 500 is transmitting high power, the Vmode control circuit 512 can set the power transistors to operate at high current state to minimize output distortion. When the device needs to transmit low power, the Vmode control circuit 512 sets the power amplifier with low current to conserve battery life. The digital control unit 513 can be programmed to store 1 bit, 2 bits or more bits of data to control the power supply voltages of the power transistors to. two, four, or more levels.

Similarly, the biasing circuit 514 can boost or reduce the biasing currents of the power transistors one or more stages in the power amplifier 511 in response to the bias control signals. The digital control unit 513 can set the power transistor to plurality of base current levels in response to output signals or other requirements by the wireless communication standards and protocols. The digital control unit 513 can be programmed to store 1 bit, 2 bits or more bits of data to control the biasing current or biasing voltage supply of the power amplifier to two, four, or more levels.

Figure 6:
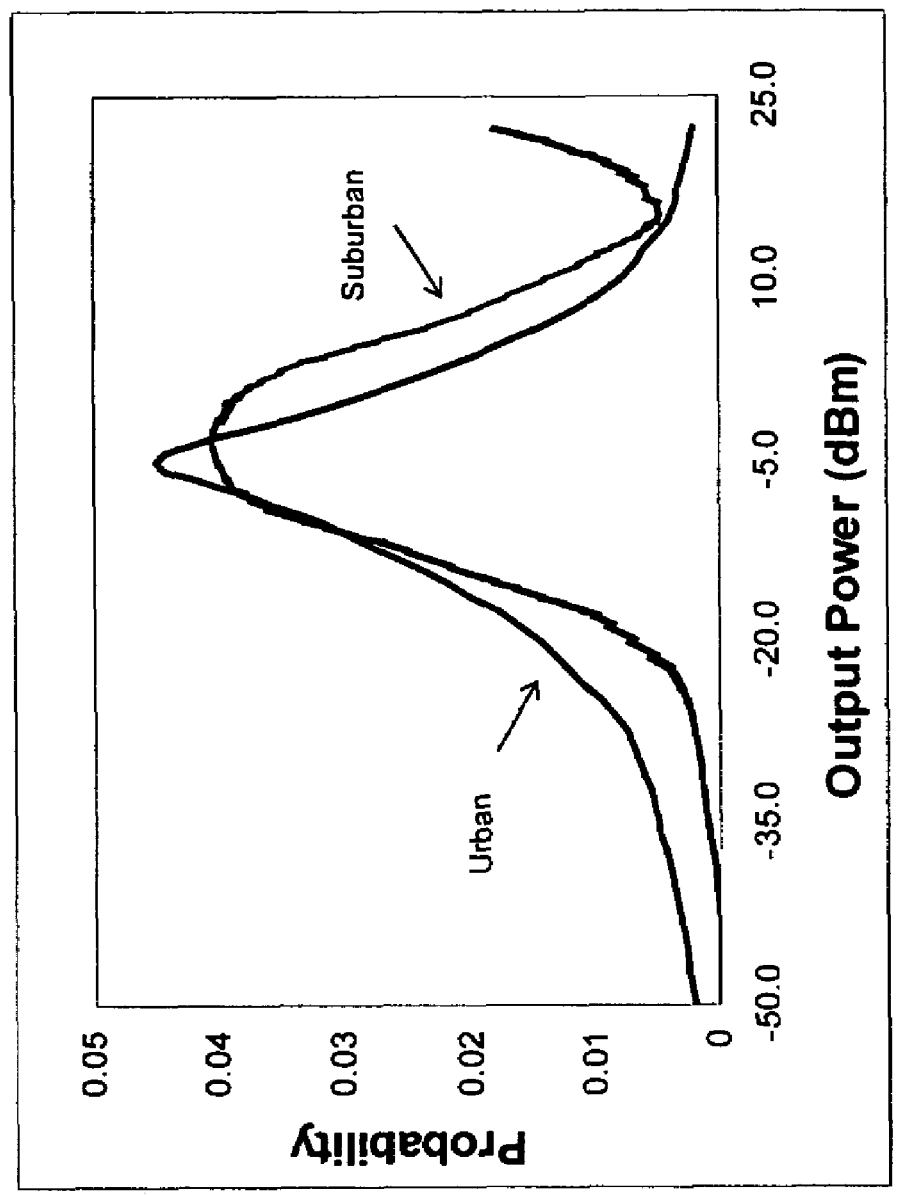
FIG. 6 shows exemplified usage probability distributions as a power of output power for a wireless communication device.

The flexibility of dynamically and digitally setting biasing states for the power transistors is very beneficial to optimize power and performance for different applications. FIG. 6 shows exemplified usage probability distributions as a power of output power for the wireless communication devices compatible with the CDMA standard. The suburban applications in general experience a higher output power distribution then urban applications. The digital control unit 513 can therefore dynamically set the power transistors to higher biasing states in suburban areas and lower biasing state in urban locations to minimize output signal distortions as well as conserving battery power.

Figure 7:
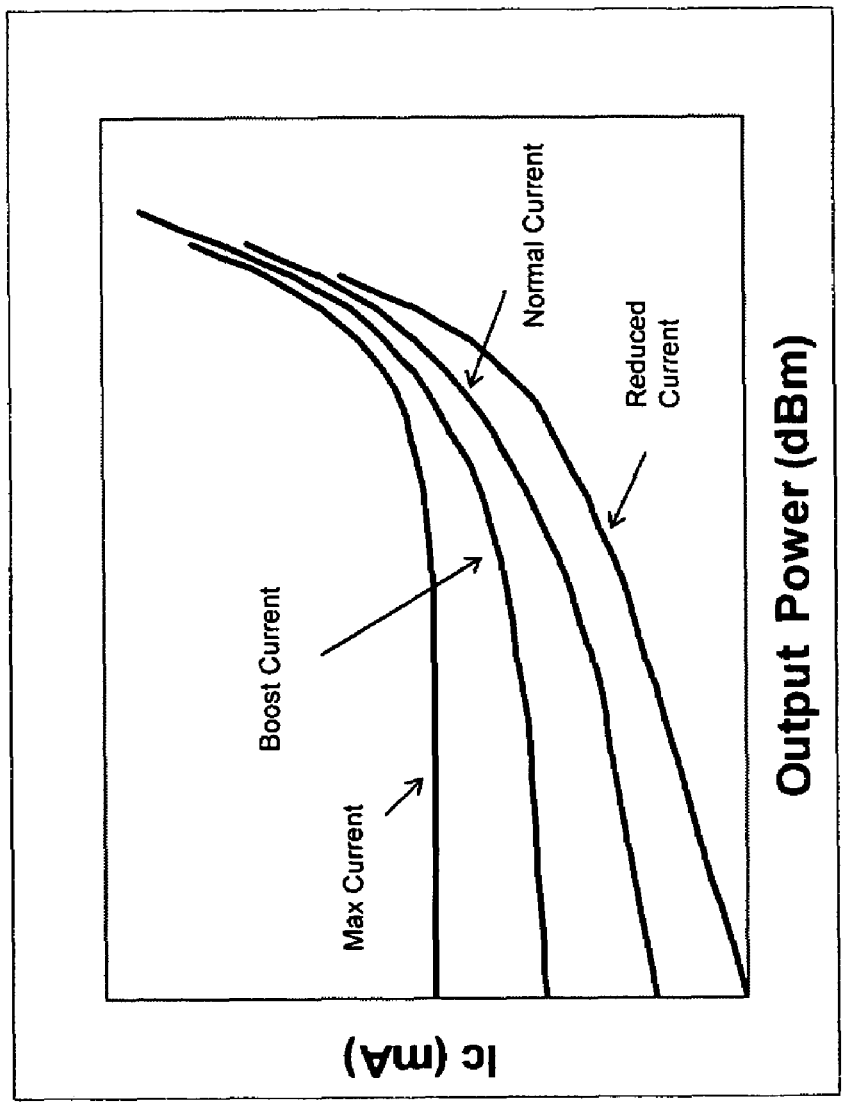
FIG. 7 illustrates current consumption of the power amplifier of FIG. 5 at different digitally controlled biasing current levels.

FIG. 7 illustrates current consumption of the power amplifier 511 at different digitally controlled biasing current levels. The biasing current can be set to a plurality of states below a maximum current: normal current, boost current, and reduced current. The base current levels can be digitally controlled by the digital control unit 513 by controlling the biasing current in the biasing circuit 514 or controlling Vcc through Vmode control 512.

Figure 8:
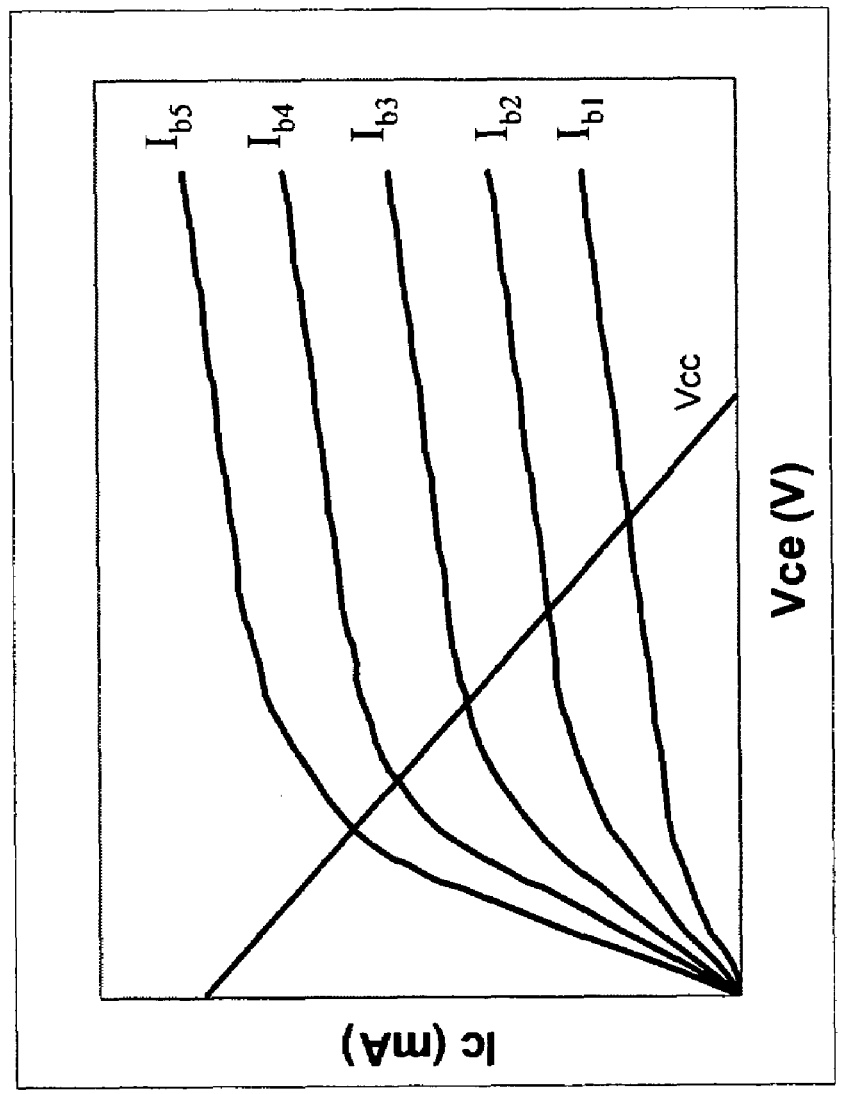
FIG. 8 illustrates a set of current-voltage curves at different biasing currents for the power amplifier of FIG. 5.
Figure 9:
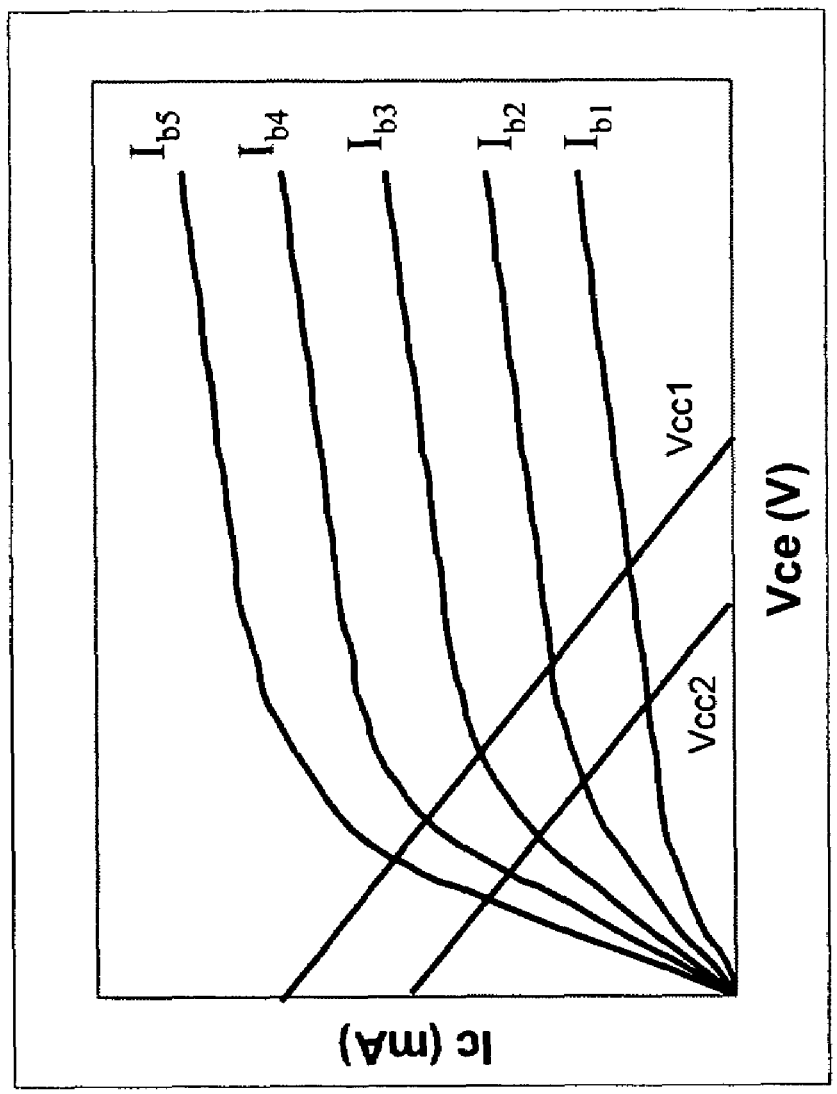
FIG. 9 illustrates a set of current-voltage curves at different biasing currents and two load curves corresponding to two digitally controlled power supply voltages in the power amplifier of FIG. 5.

FIG. 8 illustrates a family of current-voltage characteristic curves at different biasing currents $I_{b1}$, $I_{b2}$, $I_{b3}$, $I_{b4}$, and $I_{b5}$ for the power transistors in the power amplifier 511 of FIG. 5. A load curve based on a fixed Vcc value defines a plurality of current voltage states (Ic-Vce) at different biasing current levels. In accordance to the present invention, the Vcc levels can be digital controlled by the digital control unit 513. FIG. 9 illustrates current-voltage characteristic curves at different biasing currents $I_{b1}$, $I_{b2}$, $I_{b3}$, $I_{b4}$, and $I_{b5}$ and at two digitally controlled biasing voltage $V_{cc}$ at levels $V_{cc1}$ and $V_{cc2}$. Each of the two load curves corresponding to $V_{cc1}$ and $V_{cc2}$ define two sets of current voltage states (Ic-Vce) at different biasing current levels. In general, multiple bits of $V_{cc}$ levels can be set by the digital control unit 513. The combined digital control over biasing voltage Vcc and biasing current provide extended dynamic control range for the power amplifier 511, which enables its adaptability to applications under multiple wireless protocols and standards.

The wireless communication device 500 is compatible with amplifying radio frequency signals in a plurality of frequency bands. The wireless communication device 500 can comprise a plurality of power amplifiers each amplifying radio-frequency signals in different frequency bands. For example, the first power amplifier can amplify radio frequency signals in a frequency band centered around 2.5 GHz. A second power amplifier can amplify radio frequency signals in a frequency band centered around 3.5 GHz. Other radio frequencies can include 700 MHz, 800 MHz, 900 MHz, 1800 MHz, 1900 MHz, 2 GHz, 3 GHz, 5 GHz, etc. Details of power amplification for a plurality frequency bands are disclosed in U.S. patent application Ser. No. 11/039,687, titled "Multi-band power amplifier module for wireless communications" by Ichitsubo et al, filed Jan. 19, 2005, the disclosure of which is hereby incorporated by reference.

The power amplifier module 100 can further comprise frequency filter circuits and diplexers that can receive the input radio frequency signals and output a radio frequency signal at a selective frequency (e.g. one of 2.5 GHz and 3.5 GHz). The capability of dynamic bias setting in power amplifier module 510 can reduce crosstalk between adjacent channels and improves Adjacent Channel Power Ratio (ACPR). Details of frequency circuit and diplexer are disclosed in the above referenced and commonly assigned U.S. patent application Ser. No. 10/972,858, titled "Frequency filtering circuit for wireless communication devices" by Kubota et al, filed Oct. 25, 2004, filed and U.S. patent application Ser. No. 10/972,636, titled "Diplexer circuit for wireless communication devices" by Kubota et al, filed Ser. No. 10/25/2004, the disclosures of which are hereby incorporated by reference.

Other details of the operations of the bias control circuits 514 and power sensing circuit 513 as well as the design and benefits of the electric grounding in wireless power amplifier modules are disclosed in the commonly assigned and the above mentioned U.S. patent application Ser. No. 10/041,863, titled "Multilayer RF Amplifier Module" by Wang, et al., filed on Oct. 22, 2001, U.S. patent application Ser. No. 10/385,058, titled "Power amplifier Module for wireless communication devices" by Ichitsubo et al, filed on Mar. 9, 2003, U.S. patent application Ser. No. 10/385,059, titled "Accurate Power Sensing Circuit for Power Amplifiers by Ichitsubo et al, filed on Mar. 9, 2003, U.S. patent application Ser. No. 10/804,737, titled "RF front-end module for wireless communication devices" by Ichitsubo et al., filed Mar. 18, 2004. The disclosures of these applications are incorporated herein by reference.

Although specific embodiments of the present invention have been illustrated in the accompanying drawings and described in the foregoing detailed description, it will be understood that the invention is not limited to the particular embodiments described herein, but is capable of numerous rearrangements, operating frequency bands, modifications, and substitutions without departing from the scope of the invention. For example, the frequency of a power amplifier is not restricted to 2.5 GHz or 3.5 GHz. The described system is compatible with power amplification at 5 GHz, 700 MHz, or any other radio frequencies. The following claims are intended to encompass all such modifications.

What is claimed is:

1. A multi-mode power amplifier module, comprising:
   a power amplifier configured to amplify an input radio frequency signal to produce an output radio frequency signal in response to a bias control signal;
   a programmable digital control unit configured to produce the bias control signal and to transmit the bias control signal to the power amplifier; and
   a power sensing circuit configured to produce a power sensing signal in response to the output radio frequency signal and transmit the power sensing signal to the programmable digital control unit, wherein the programmable digital control unit is configured to produce the bias control signal or a voltage-mode control signal in response to the power sensing signal.

2. The multi-mode power amplifier module of claim 1, further comprising a biasing circuit configured to receive the bias control signal from the programmable digital control unit and to control the biasing current or biasing voltage of the power amplifier to a plurality of levels.

3. The multi-mode power amplifier module of claim 2, wherein the programmable digital control unit is configured to produce a bias control signal to boost or reduce the level of the biasing current or biasing voltage in the power amplifier.

4. The multi-mode power amplifier module of claim 2, wherein the programmable digital control unit is configured to receive serial or parallel digital control signals.

5. The multi-mode power amplifier module of claim 2, wherein the programmable digital control unit is configured to control the biasing current or the biasing voltage of the power amplifier to two (1 bit), four (2 bits), or eight (3 bits) levels.

6. The multi-mode power amplifier module of claim 1, wherein the programmable digital control unit is configured to provide a voltage-mode control signal to digitally control the power supply voltage to the power amplifier to a plurality of values.

7. The multi-mode power amplifier module of claim 6, wherein the programmable digital control unit is configured to control the power supply voltage of the power amplifier to two (1 bit), four, (2 bits) or eight (3 bits) levels.

8. The multi-mode power amplifier module of claim 1, wherein the programmable digital control unit is configured to produce a first bias control signal in suburban areas and to produce a second bias control signal in urban areas, wherein the first biasing control signal is configured to produce a higher biasing state in the power amplifier than the second biasing control signal.

9. The multi-mode power amplifier module of claim 1, wherein the programmable digital control unit is configured to produce the bias control signal or a voltage-mode control signal in response to the power sensing signal.

10. The multi-mode power amplifier module of claim 1, wherein the power sensing circuit detects the output radio frequency signal by capacitance coupling.

11. The multi-mode power amplifier module of claim 1, wherein the output radio frequency signal is transmitted in a frequency band centered at about 2.5 GHz, 3.5 GHz, or 5 GHz.

12. A multi-mode power amplifier module, comprising:
a power amplifier configured to amplify an input radio frequency signal to produce an output radio frequency signal in response to a base current and a power supply voltage;
a programmable digital control unit configured to digitally produce a bias control signal and to digitally control the power supply voltage to a plurality of levels; and
a biasing circuit configured to receive the bias control signal from the programmable digital control unit and to control the biasing current or the biasing voltage of the power amplifier to one of a plurality of levels.

13. The multi-mode power amplifier module of claim 12, wherein the programmable digital control unit is configured to provide the bias control signal to boost or reduce the base current in the power amplifier.

14. The multi-mode power amplifier module of claim 12, wherein the programmable digital control unit is configured to control the biasing current or the biasing voltage of the power amplifier to two (1 bit), four (2 bits), or eight (3 bits) levels.

15. The multi-mode power amplifier module of claim 12, wherein the programmable digital control unit is configured to control the power supply voltage of the power amplifier to two (1 bit), four, (2 bits) or eight (3 bits) levels.

16. The multi-mode power amplifier module of claim 12, further comprising a power sensing circuit configured to produce a power sensing signal in response to the output radio frequency signal and transmit the power sensing signal to the programmable digital control unit.

17. The multi-mode power amplifier module of claim 16, wherein the programmable digital control unit is configured to control the base current or the power supply voltage of the power amplifier in response to the power sensing signal.

18. A wireless communication device capable of transmitting and receiving wireless signals at multiple standards, comprising:
an antenna adapted to receive a wireless signal at one of a plurality of wireless standards and to produce an input radio frequency signal;
a power amplifier configured to amplify the input radio frequency signal to produce an output radio frequency signal in response to a base current and a power supply voltage;
a programmable digital control unit configured to digitally produce a bias control signal and to digitally control the power supply voltage to a plurality of levels;
a biasing circuit configured to receive the bias control signal from the programmable digital control unit and to control the biasing current or the biasing voltage of the power amplifier to one of a plurality of levels; and
a base band processor configured to digitally process the output radio frequency signal.

19. The wireless communication device of claim 18, wherein the programmable digital control unit is configured to produce the bias control signal based on a wireless communication standard selected from the group consisting of Global System for Mobile Communications (GSM), General Packet Radio Service (GPRS), EDGE, Code Division Multiple Access (CDMA), Wideband CDMA, TD-SCDMA, Universal Mobile Telecommunications System (UMTS), Wi-Fi, IEEE 802.11, and Wi-Max.

20. The wireless communication device of claim 18, wherein the programmable digital control unit is configured to produce a first bias control signal in suburban areas and to produce a second bias control signal in urban areas, wherein the first biasing control signal is configured to produce a higher biasing state in the power amplifier than the second biasing control signal.

* * * * *